United States Patent
Shia et al.

(10) Patent No.: US 7,358,805 B2
(45) Date of Patent: Apr. 15, 2008

(54) FULLY DIFFERENTIAL SENSING APPARATUS AND INPUT COMMON-MODE FEEDBACK CIRCUIT THEREOF

(75) Inventors: Tim K. Shia, Taichung County (TW); Chi-Chen Chung, Pingtung County (TW); Long-Xi Chang, Yilan County (TW)

(73) Assignee: Industrial Technology Research Institute, Hsinchu (TW)

( * ) Notice: Subject to any disclaimer, the term of this patent is extended or adjusted under 35 U.S.C. 154(b) by 29 days.

(21) Appl. No.: 11/467,170

(22) Filed: Aug. 25, 2006

(65) Prior Publication Data

US 2007/0285166 A1 Dec. 13, 2007

(30) Foreign Application Priority Data

May 23, 2006 (TW) ................. 95118210 A

(51) Int. Cl.
*H03F 3/45* (2006.01)
(52) U.S. Cl. ......................... 330/69; 330/258
(58) Field of Classification Search ............ 330/69, 330/258, 252
See application file for complete search history.

(56) References Cited

U.S. PATENT DOCUMENTS

| | | | |
|---|---|---|---|
| 6,498,530 B1* | 12/2002 | Tang | 330/9 |
| 6,573,785 B1* | 6/2003 | Callicotte et al. | 330/9 |
| 6,798,280 B2* | 9/2004 | Rossi | 330/9 |
| 6,822,509 B2* | 11/2004 | Muza | 330/9 |

* cited by examiner

*Primary Examiner*—Henry Choe
(74) *Attorney, Agent, or Firm*—Jianq Chyun IP Office

(57) ABSTRACT

A fully differential sensing apparatus and an input common mode feedback circuit are provided. The input common mode feedback circuit includes a common mode error amplifier and a plurality of adaptive conductance elements. Each adaptive conductance element behaves with a low impedance characteristic when its anode voltage is greater than its cathode voltage by a positive threshold voltage or, on the contrary, when the anode voltage of such an adaptive conductance element is lower than its cathode voltage by a negative threshold voltage, the adaptive element also behaves with a low impedance characteristic; otherwise the aforementioned adaptive conductance element behaves with a high impedance characteristic. The common mode error amplifier and a plurality of such adaptive conductance elements form a negative feedback loop to effectively maintain the input common voltage of a fully differential input amplifier, which can be used for a fully differential sensing apparatus.

15 Claims, 6 Drawing Sheets

FULLY DIFFERENTIAL SENSING APPARATUS AND INPUT COMMON-MODE FEEDBACK CIRCUIT THEREOF

CROSS-REFERENCE TO RELATED APPLICATION

This application claims the priority benefit of Taiwan application serial no. 95118210, filed on May 23, 2006. All disclosure of the Taiwan application is incorporated herein by reference.

BACKGROUND OF THE INVENTION

1. Field of Invention

The present invention relates to a circuit for maintaining the input common-mode voltage of a differential input amplifier, and more particularly, to an input common-mode feedback circuit applicable to a differential input amplifier and a fully differential sensing apparatus applying the aforementioned input common-mode feedback circuit.

2. Description of the Related Art

In the field of capacitive sensing applications, the sensed parameters can be dielectric constant, capacitance gap distance or capacitance area. Very often at least one of these parameters changes corresponding to an external stimulus. The sensed stimulus (for example, physical quantities such as pressure, movement or dielectric constant between sensing capacitor electrodes) can be very small to detect. Therefore it is helpful to lower the noise floor in the detection interface circuitry to allow enough signal range to detect. The often used technique of synchronous modulation and demodulation is to bring the baseband signal to a higher carrier frequency where flicker noise (or 1/f noise) is essentially lower to enhance signal to noise ratio (SNR), amplify the modulated signal at lower noise floor and restore modulated signal to baseband signal by demodulation and low pass filtering.

The sensing capacitors are intrinsically small voltage sources with very high output capacitive impedance compared to more typical voltage sources with low output resistive impedance. Two types of amplifiers are often used to convert such a high output impedance voltage source to a low output impedance voltage source for further amplification and voltage signal processing. One of these two types of amplifier configurations is a high impedance amplifier that presents, in a closed-loop buffer configuration, very high input impedance in order to take signal voltage from the capacitive source(s) within negligible portion of time constant of capacitive source and its high impedance path to an ac ground point on its charging loop. That is, net charge flow will be mostly constrained to nearly zero. When the nominal value of the capacitive source changes with external stimulus, the constrained charge will hence allow a corresponding ac voltage on the capacitive source. The other type of amplifier is a low impedance amplifier that presents, in a closed-loop integrator configuration, very low input impedance in order to take most charge flow from capacitive source(s), integrate it through a feedback capacitor and make it a voltage output at low impedance amplifier's output stage. Our proposed invention introduced new interface circuit architecture for the latter type of capacitive amplifier, particularly implemented with differential input configuration.

The capacitive source when biased at a fixed cross-terminal voltage can only hold fixed charges. The cross-terminal voltage is usually established by a biasing voltage at one of its capacitor plate and a reference voltage at the other plate connected to an input node of a low impedance amplifier. Whenever the nominal capacitance of sensing capacitor changes due to an external stimulus, the charges must be provided or go away and hence a charge flow goes into/from the capacitive source(s) from/to the input node(s) of the aforementioned low impedance amplifier. The higher the cross-terminal biasing voltage is, the larger the charge flow will be integrated through a feedback capacitor and hence larger baseband voltage can be generated at the low impedance amplifier's output stage when given the same nominal source capacitance change.

FIG. 1 is a circuit diagram of a conventional fully differential charge integration amplifier. Referring to FIG. 1, the fully differential charge integration amplifier 100 comprises a differential capacitive pair cs1 and cs2, feedback integration capacitors cf1 and cf2 and a fully differential input amplifier 101. FIG. 2 is a diagram of a conventional charge integration amplifier and its input common-mode feedback circuit based on the principle of charge cancellation at the input nodes of the main amplifier 101.

The synchronous modulation technique mentioned above for capacitive sensing is often implemented for the low impedance amplifier by modulating the biasing voltage at a higher carrier frequency. It has been described above that fixed amount of charge resides on the nominal capacitive source biased by a fixed cross-terminal voltage. When an unbalanced condition happens due to external stimulus to cause nominal capacitance change, it is desired that most charge flow goes through the feedback integration capacitor (Cf1 and Cf2 in FIG. 1) in order to obtain more useful voltage signal range. This can be achieved by minimizing the parasitic capacitance between capacitive source and the input node of the low impedance amplifier and also by virtual-shorting the input nodal voltage to a set input common mode voltage of the low impedance amplifier to make the amplifier's input node a nearly zero impedance ac ground node to maintain accurate biasing voltage across the source capacitor and to shield the parasitic capacitive leakage path at amplifier's input node(s). When the biasing voltage is modulated at a carrier frequency much higher than the baseband frequency, charge flow starts to flow in and out much faster than when biasing voltage is a fixed value. If no enough charges can be provided and/or removed in a timely manner, the cross-terminal voltage of the nominal capacitance will very possibly not be able to be maintained or in another word, the input common mode voltage of low impedance amplifier can quickly move away until the amplifier fails to work normally.

Often used solution to mitigate this addressed problem is to setup two differential capacitive sources in a pair configuration by applying two out-of-phase modulated biasing voltages at outer terminals of the capacitive source pair and taking the middle node of the pair to the inverting node of a single-ended low impedance amplifier, or in the differential input configuration, to set up four differential capacitive sources in a Wheatstone bridge fashion (i.e. to shunt one differential capacitive source pair with the other in a reversed direction) by applying two out-of-phase modulated biasing voltages at the outer terminals of two differential capacitive source pairs and taking two middle nodes of the Wheatstone bridge to the input nodes of a differential low impedance amplifier. The opposite charge flows due to the out-of-phase modulated biasing voltages will be quickly nulled out in the middle node(s), hence induce little operating point shift at these middle node(s) that is/are connected to the low impedance amplifier input node(s).

The third solution proposed by Lemkin and Boser et al is to setup a differential capacitive pair (Cs1 and Cs2 in FIG. 1), apply a single modulated biasing voltage (Vstep in FIG. 1) at middle of this capacitive source pair and connect the outer terminals of capacitive source pair to the input nodes of a differential low impedance amplifier (101 in FIG. 1). But an error amplifier (201a in FIG. 2) with two local feedback capacitors (Cb1 and Cb2 in FIG. 2) which are connected between error amplifier's output and differential low impedance amplifier's input nodes is required to amplify the error voltage between a set common mode voltage (Vicm in FIG. 2) and measured common mode voltage at low impedance amplifier's input nodes. The error amplifier and two local feedback capacitors forms a negative feedback loop and compose an input common mode feedback (ICMFB) circuit for the low impedance amplifier. Opposite charge will be injected to the outer terminals (or input nodes of the differential input amplifier) of the differential capacitive source pair by the amplified error voltage (alpha*Vstep in FIG. 2) through the error amplifier's local feedback capacitors (Cb1 and Cb2 in FIG. 2) in order to restore the input common mode voltage of the differential low impedance amplifier back to the set value for normal operation. And a defined high impedance path will be needed in shunt with the low impedance amplifier's integration capacitors (Cf1 and Cf2 in FIG. 1) to properly maintain a stable dc operating point at its input nodes. The output voltage, deltaV($\Delta$V), can be estimated by the formula listed below where Cf is the feedback integration capacitor, deltaC($\Delta$C) is source capacitance change and Vbias=Vstep−Vicm is the cross-terminal biasing voltage if the input common mode voltage is set at a zero reference voltage (Vicm=0V).

$$\Delta \propto Vstep \times (\Delta C/Cf)$$

The first two aforementioned solutions will have degraded performance if mismatch between source capacitors exists. The third proposed solution explained in the previous paragraph requires engineering tuned combination of Cs and Cb and alpha parameters so that opposite charges through Cs and Cb can exactly cancel with each other at the input nodes of low impedance amplifier and thus no input common mode voltage change will be caused. In case that the nominal capacitive sources (Cs1 and Cs2) can be application dependent, or field dependent, the best parameter combination cannot be maintained for all applications thereof, hence the input common mode voltage of the differential low impedance amplifier can move up and down with the modulated biasing voltage, Vstep. Thus not only will signal strength be reduced but also unwanted distortions can be generated herewith. Although resistors in shunt with Cf1 and Cf2 can help to lessen this input common mode movement with modulated biasing voltage, yet a high pass corner of Whpc decided by the Cf and shunt resistor Rf (Whpc=1/(Cf*Rf)) can be a limitation to lower the time constant of Cf*Rf where this time constant should be otherwise small enough compared to the modulating biasing voltage period. That is, to achieve smaller Cf*Rf time constant will inevitably hurt the transfer gain below Whpc. Generally speaking, Rf can be too large to fabricate with a linear resistor (e.g. poly or diffusion resistors); Very often it is fabricated by a MOS resistor where its small conductance is controlled by its gate voltage.

SUMMARY OF THE INVENTION

The present invention provides an input common-mode feedback circuit, which comprises a plurality of adaptive conductance elements and an input common-mode error amplifier to form a negative feedback loop to inhibit the input common mode voltage shift at the input nodes of a differential input amplifier. The feedback network comprises a feedback impedance across the input node(s) and output node(s) of the differential amplifier and an input impedance which is responsible for coupling source voltage(s) (or biasing voltage(s)) to the input nodes of differential amplifier. The closed-loop feedback is a shunt-shunt feedback to provide a reduced input impedance and output impedance directly toward the input node(s) and output node(s) of the differential amplifier. Therefore the differential amplifier, in the closed-loop configuration, is often called a low impedance (low Z) amplifier. The input impedance composes part of the feedback loop and can be made responsive to an external stimulus (e.g. a physical or chemical quantity). In the case where the input impedance on the feedback loop is made of a condenser capacitor that changes its nominal capacitance with respect to an external stimulus and the feedback impedance on the feedback loop is made of a fixed integration capacitor, this closed-loop low impedance amplifier becomes a sensing apparatus to convert the external stimulus into a voltage output with certain proportionality or gain. Hence, the input common mode feedback circuit together with the differential amplifier and its feedback network comprise a charge integration amplifier. Given a stand of view at the input nodes of the differential amplifier, the source voltage (or biasing voltage) will have equivalent source output impedance exactly the same as the input impedance on the feedback loop. It should be noted that when a fixed dc biasing voltage is applied to the input impedance of the feedback loop, the input impedance (in the case of condenser capacitor) will have net charge flow exchange with the feedback impedance (in the case of an integration capacitor). This described scenario can have an equivalent counterpart when we replace the fixed dc biasing voltage with a baseband source voltage, and substitute the condenser capacitor with a fixed capacitor of the same value as the nominal value of the condenser capacitor. Of course, this is only valid when the input nodal voltages of the differential amplifier are virtual short to their input common mode voltage. Ideally the net charge flow from the capacitive source sees a virtual ac ground at the input nodes of the differential amplifier and will be fully taken to the integration capacitor. But in reality, the input nodes of the differential amplifier can be constantly deviating slightly from a set common mode voltage. This can cause unwanted charge leak to the parasitic capacitance between the capacitive sources and the input nodes of the differential amplifier, and reduce the transfer gain of this charge integration amplifier. This situation becomes worse when the modulated biasing voltage is applied to the capacitive sources. The modulated voltage can swing the input common mode voltage at the input nodes of the differential amplifier through the capacitive sources way too far and make this charge integration amplifier stop to function correctly. Therefore it is important that input common mode should be carefully maintained for a charge integration amplifier.

The described technique in the background of invention to add a dc path from differential amplifier's output to its input node could help to define a dc operating point at input node(s) but not suffice to restore the input common mode fast enough if the resistance value of the dc path and the feedback integration capacitor comprise a time constant that is too large to do something useful in time. Therefore, the goal of this invention is to design an input common mode feedback circuit to define a specific dc operating point for the input nodes of the differential amplifier, effectively maintain the input common mode voltage on these input nodes and to introduce negligible charge leak path for the capacitive source(s) so that net charge flow from the capacitive source(s) can be fully taken to the feedback integration capacitor.

The adaptive conductance elements and the error amplifier are designed for this purpose. When the input common mode voltage at the input nodes of the differential amplifier falls within a small tolerance away from the set value, these adaptive conductance elements are in the state of high impedance and the capacitive source(s) sees no extra charge leak path. The high impedance state and the capacitive source can constitute a high pass corner at a very low frequency so that transfer gain at low frequency baseband won't be hurt at all. When the input common mode voltage at the input nodes of the differential amplifier starts to deviate out of a small range from the set value, these adaptive conductance elements will be turned into a low impedance state, making the input common mode feedback circuit a negative feedback loop to fast restore the error to nearly a zero value and then turned into high impedance state again. It is also worthwhile our suggesting attention that dc offset very often should be carefully taken care of within the differential amplifier itself for a typical charge integration amplifier to ensure that the differential amplifier can work at correct operating point.

The inventors contemplate that the invented input common mode feedback circuit can not only be applied to the aforementioned charge integration apparatus but also be applied to wherever a differential input amplifier requires this functionality no matter how its feedback network is constituted. And the invented sensing apparatus can certainly improve some previous problem found in various prior art and contribute some advantages to circuit architecture of charge integration amplifier.

More detailed embodiments will be given in next sections to help further understanding of this invention.

BRIEF DESCRIPTION OF THE DRAWINGS

The accompanying drawings illustrate embodiments of the invention and, together with the following description, serve to explain the principles and advantages of the invention.

DESCRIPTION OF EMBODIMENTS

Figure 1:
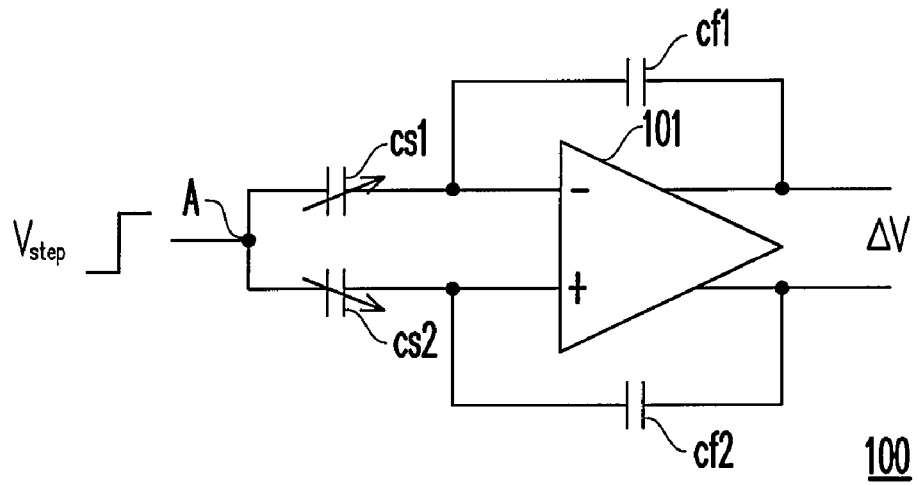
FIG. 1 is a circuit diagram of a conventional fully differential charge integration amplifier.
Figure 2:
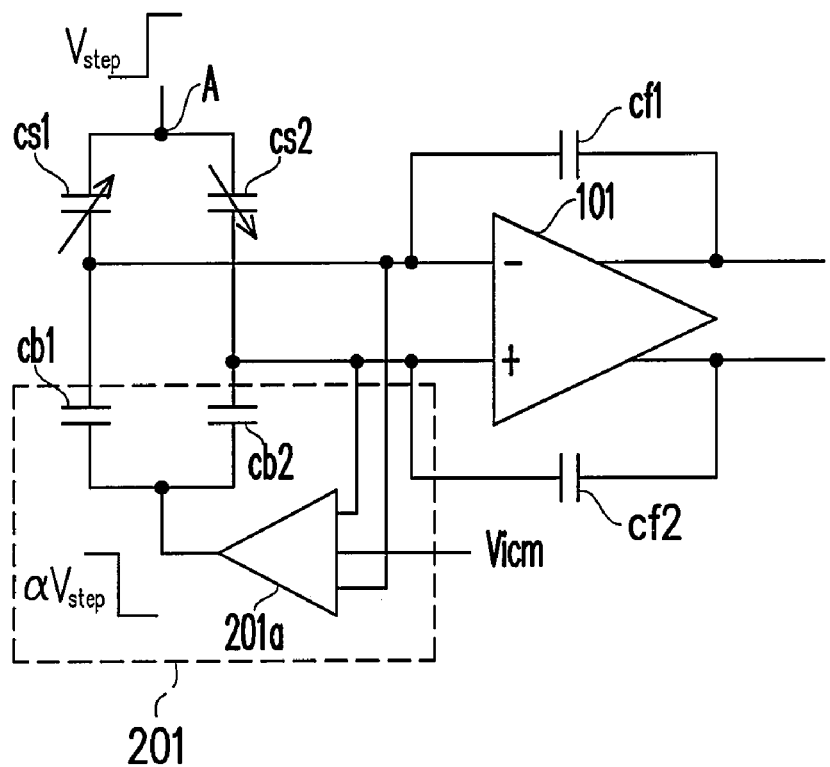
FIG. 2 is a diagram of a conventional charge integration amplifier and its input common-mode feedback circuit based on the principle of charge cancellation at the input nodes of the main amplifier 101.
Figure 3:
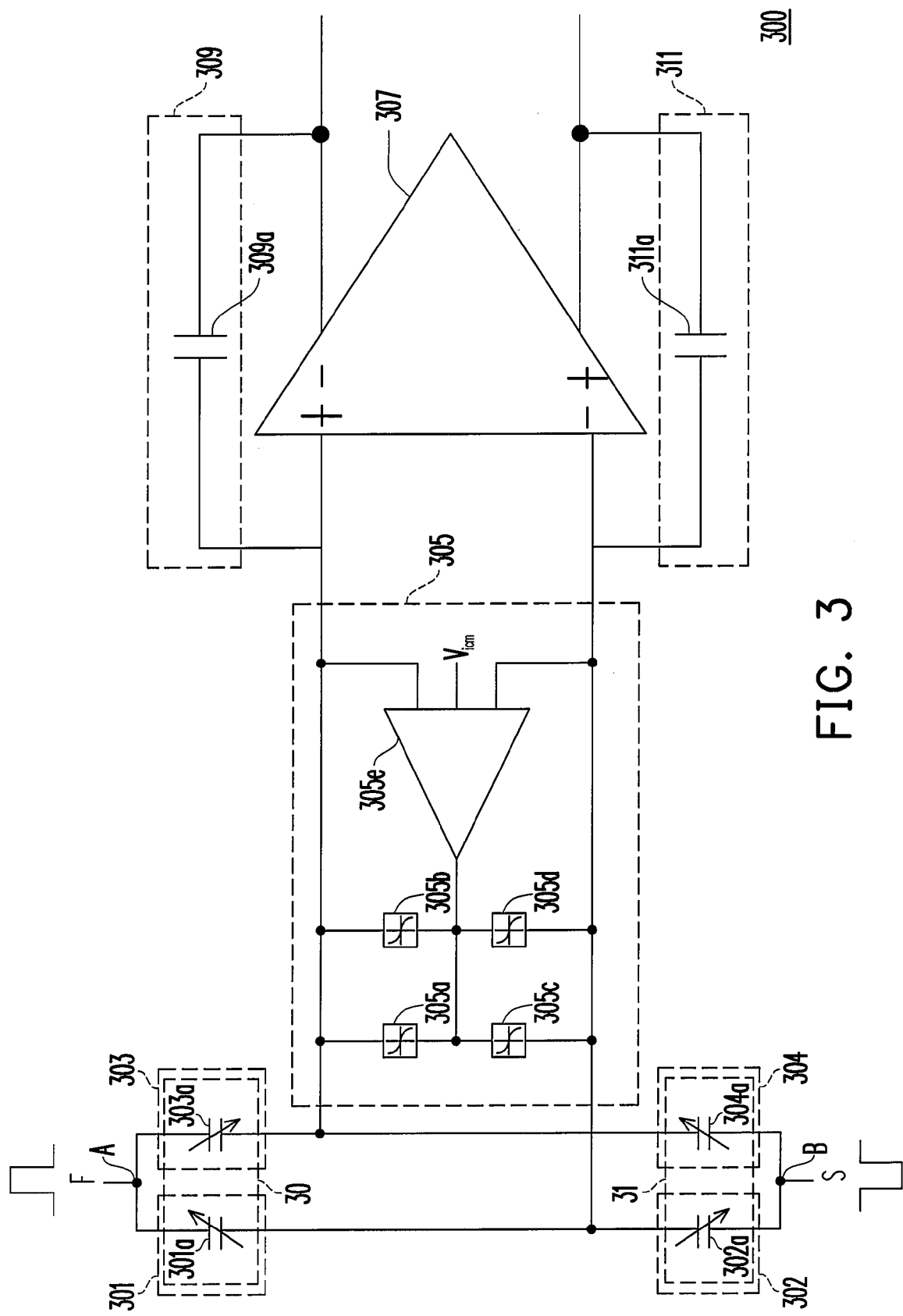
FIG. 3 is a circuit diagram of the fully differential sensing apparatus according to a preferred embodiment of the present invention.

The following description is provided to explain some applicable usage of current invention. Various modifications and other alterations in the structure and method of operations within the spirit and scope of this invention, however, will remain apparent to those skilled in the art, since the problems to solve and principles to use have been defined and explained within this invention. FIG. 3 is a circuit diagram of a fully differential sensing apparatus based on an embodiment of the present invention. Referring to FIG. 3, a fully differential sensing apparatus 300 includes a first input impedance 301, a second input impedance 303, an input common-mode feedback (ICMFB) circuit 305, a fully differential amplifier 307, a first feedback impedance 309, and a second feedback impedance 311. In the present embodiment, the fully differential sensing apparatus 300 may further include third input impedance 302 and fourth input impedance 304. It should be noted that the present invention is applicable but not limited to the input impedance combination described herein. For example, an alternative input impedance combination can be one of impedance group "30" with one of impedance group "31" in FIG. 3. The source voltages or biasing voltages can come from node A and/or node B in FIG. 3 through the aforementioned possible input impedance combination and the input common mode feedback circuit 305 to the differential input amplifier 307.

The first input impedance 301 can consist of a sensing capacitor 301a, and the second input impedance 303 can consist of a sensing capacitor 303a. The sensing capacitors 301a and 303a form a first differential sensing capacitor pair 30. The third input impedance 302 can consist of a sensing capacitor 302a, and the fourth input impedance 304 can consist of a sensing capacitor 304a. The sensing capacitors 302a and 304a form a second group of differential sensing capacitor pair 31 In the present embodiment, although the aforementioned input impedance 301~304 are capacitive impedance elements, yet they can be other types of input impedance in an alternative embodiment based on this invention.

The input common-mode feedback circuit 305 includes a first adaptive conductance element 305a, a second adaptive conductance element 305b, a third adaptive conductance element 305c, a fourth adaptive conductance element 305d and a common-mode error amplifier 305e. Every one of the adaptive conductance elements 305a~305d has an anode and a cathode respectively, and behaves with a low impedance characteristic when the anode voltage thereof is greater than the cathode voltage thereof by a positive threshold voltage (Vtp) or when the anode voltage thereof is lower than the cathode voltage thereof by a negative threshold voltage (Vtn). Otherwise, the adaptive conductance elements behave with a high impedance characteristic. The anode of 305a is connected to the cathode of 305b and the cathode of 305a is connected to anode of 305b. Likewise, the anode of 305c is connected the cathode of 305d and the cathode of 305c is connected to the anode of 305d. Therefore, 305a and 305b comprise an adaptive conductance pair while 305c and 305d comprise another adaptive conductance pair. In the present embodiment, the adaptive conductance elements 305a~305d can be implemented with PMOS transistors or diodes.

Figure 4:
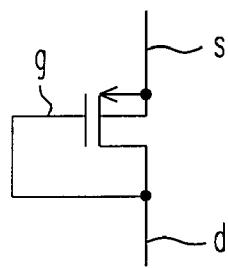
FIG. 4 is a schematic view of the adaptive conductance element formed by the PMOS transistor.
Figure 5:
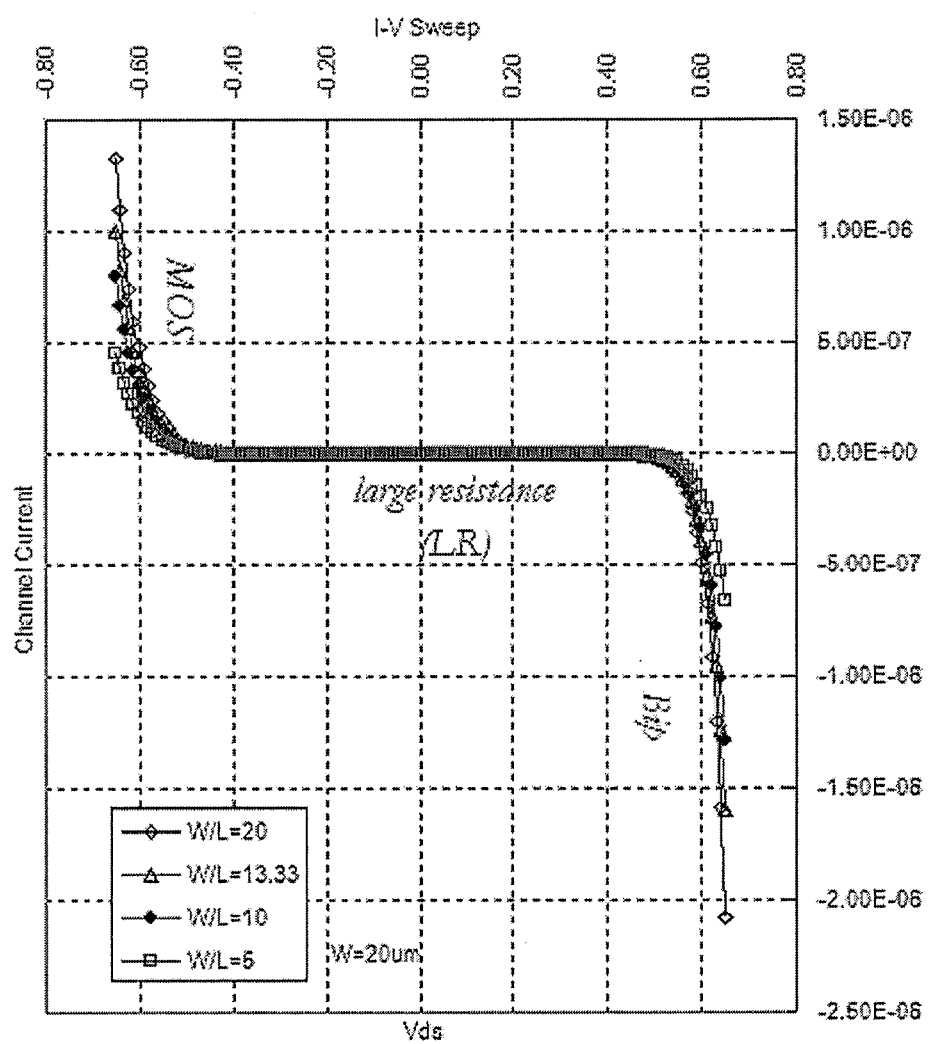
FIG. 5 is an I-V characteristic curve of the adaptive conductance element used in a preferred embodiment of present invention thereof.

FIG. 4 is a schematic view of one of the adaptive conductance elements 305a~305d formed by a diode-connected PMOS transistor. FIG. 5 is a drawing of the I-V characteristic curves of such a diode-connected PMOS. The voltage on the horizontal axis represents the source to drain voltage (Vsd) and the current on the vertical axis represents the source drain current. The I-V curves can be slightly different with different CMOS processes. But broadly speaking, the corners and curve shaping of the I-V characteristics will be very much alike to one another. Referring to FIG. 4 and FIG. 5, the adaptive conductance elements 305a~305d are diode-connected PMOS transistors, that is, the gate g and the drain d of the PMOS transistor are connected together, and the N-well (not shown) is connected to the source s of the PMOS transistor. The number of the fingers of the PMOS transistor may be an integer larger than or equal to 1. In the present embodiment, the drain terminal of the PMOS transistor is defined as the anode for the adaptive conductance elements 305a~305d, and the source terminal of the PMOS transistor is defined as the cathode for the adaptive conductance elements 305a~305b.

Referring to FIG. 5, the I-V characteristic curve can be categorized into three regions: [1] the "MOS" region where a diode-connected PMOS transistor is typically operated or where its negative gate source voltage is smaller than its negative threshold voltage, Vgs<Vth, typical Vth of a PMOS can be −0.5V to −0.8V [2] the "Bip" region where the PMOS' drain voltage is higher than its source voltage and its parasitic bipolar transistor through the N-well starts to dominate the conductance (Vsd<-0.6V) and [3] the large resistance "LR" region where the (Vsd>0 and Vgs>Vth) or (−0.6V<Vsd<0).

In terms of our defined anode and cathode annotations, the "MOS" region is where a diode-connected PMOS is operated at its saturation region, and the source drain current follows basically the square law; The cathode (the source terminal) voltage is larger than the anode (the drain terminal) voltage by a negative threshold voltage (Vtn) in the range of 0.5V to 0.8V. The "Bip" region is where the anode (the drain terminal) voltage is larger than the cathode (the source terminal) voltage by a positive threshold voltage (Vtp) in the range of 0.5V to 0.7V and the current conduction follows basically the exponential law for a bipolar transistor. It should be mentioned that when anode voltage is further larger than the cathode voltage by a PN junction forward biasing voltage in the range of 0.6V~0.7V, the conduction current will also grow exponentially. Therefore, it can be deduced that the "Bip" region will have much higher conductance than "MOS" region when Vds>0.7V. Between "MOS" and "Bip" regions is the "LR" region where a high resistance is defined for the diode-connected PMOS.

Accordingly, it can be understood that such a conductance element can be controlled by the anode-cathode voltage (or the drain-source) voltage. The sensitivity of transforming a high impedance element into a low impedance element or vice versa depends on either Vtp or Vtn values. The smaller Vtp (or Vtn) is, the more sensitive the adaptive conductance element will be. Within the scope of this invention, two such adaptive conductance elements are connected in parallel with reversed anode-to-cathode directions to each other to improve the sensitivity of such an adaptive conductance pair (305a,b and 305c,d). The sensitivity will be decided by whichever of Vtp and Vtn is smaller. And another advantage of such pairing is to improve the linearity of I-V characteristic curve across the zero Vsd point. As we have explained in the previous paragraph that the "MOS" and "Bip" regions follow square and exponential laws respectively, the proposed pairing will make the larger exponential law dominate on both sides across the zero Vsd point. If we zoom into the neighborhood of zero Vsd point, such an adaptive conductance pair provides a nearly straight I-V curve like a linear resistor. Applications which requires very large resistor implemented by the "LR" region of the proposed adaptive conductance pair will not suffer too much from the distortion because the proposed pairing offers much better linearity in the impedance control.

It should be noted that each of the adaptive conductance elements 305a~305d can be considered as two diodes connected in parallel and in reversed polarities. Therefore, in an alternative embodiment of the present invention, for the adaptive conductance elements 305a~305d, the diodes can be used to replace the adaptive conductance elements 305a~305d formed by diode-connected PMOS transistors, which can also achieve the same spirit of the present invention but work with lower sensitivity. (Vtp or Vtn>0.7V).

Referring to FIG. 3, the common-mode error amplifier 305e is used to retrieve the nodal voltages at the input nodes of the differential input amplifier 307, compare and amplify the error between the measured common mode voltage (or the average voltage of sum of both nodal voltages at the input nodes of 307) and the set common mode voltage, Vicm. This amplified error voltage can enable the adaptive conductance pairs (305a,b and 305c,d), transforming the ICMFB loop into a buffer loop to restore the error to nearly zero within a very short period of time. When the error is cleared, the adaptive conductance pairs quickly turn into the state of very high impedance and create no charge flow leak path at the input nodes of the differential input amplifier 307. Therefore, the dc operating points at the input nodes of the differential input amplifier 307 can be well maintained and most current will be taken to the feedback impedance 309 and 311. In addition, for capacitive impedance 301a to 304a, the high impedance state of 305a to 305d will allow a high pass corner (Whpc) at a very low frequency hence maintain enough transfer gain for the baseband signals. The first feedback impedance 309 can consist of a first integrating capacitor 309a, and the second feedback impedance 311 can consist of a second integrating capacitor 311a. The integrating capacitors 309a and 311a and differential input amplifier 307 are used to integrate the charge flow from the embodied capacitive sources 301a to 304a and convert the source capacitance (301a to 304a) change to a voltage output with much smaller output impedance for further voltage signal amplification and processing.

Conventional approach as explained in the background of invention will typically need to add a large resistor (very often fabricated by nonlinear gate voltage controlled MOS resistor) in shunt with the feedback integration capacitor in order to define a dc path for the input nodes of differential input amplifier 307, but this large resistor will not help too much to restore the input common mode change due to its large time constant with the feedback integration capacitor. This invention removes this limitation and allows enough transfer gain for very low input frequency. The ICMFB circuit based on the principle of charge canceling introduced in the background of invention requires engineering tuned combination of Cs and Cb and alpha parameters so that opposite charges through Cs and Cb can exactly cancel with each other at input nodes of the differential input amplifier. However, such an ICMFB circuit performance can degrade with field dependent capacitive sources. The invented ICMFB circuit can better work without this limitation. Moreover, the invented ICMFB circuit requires no capacitors to match source capacitances, and therefore can save much valuable silicon area.

Figure 6:
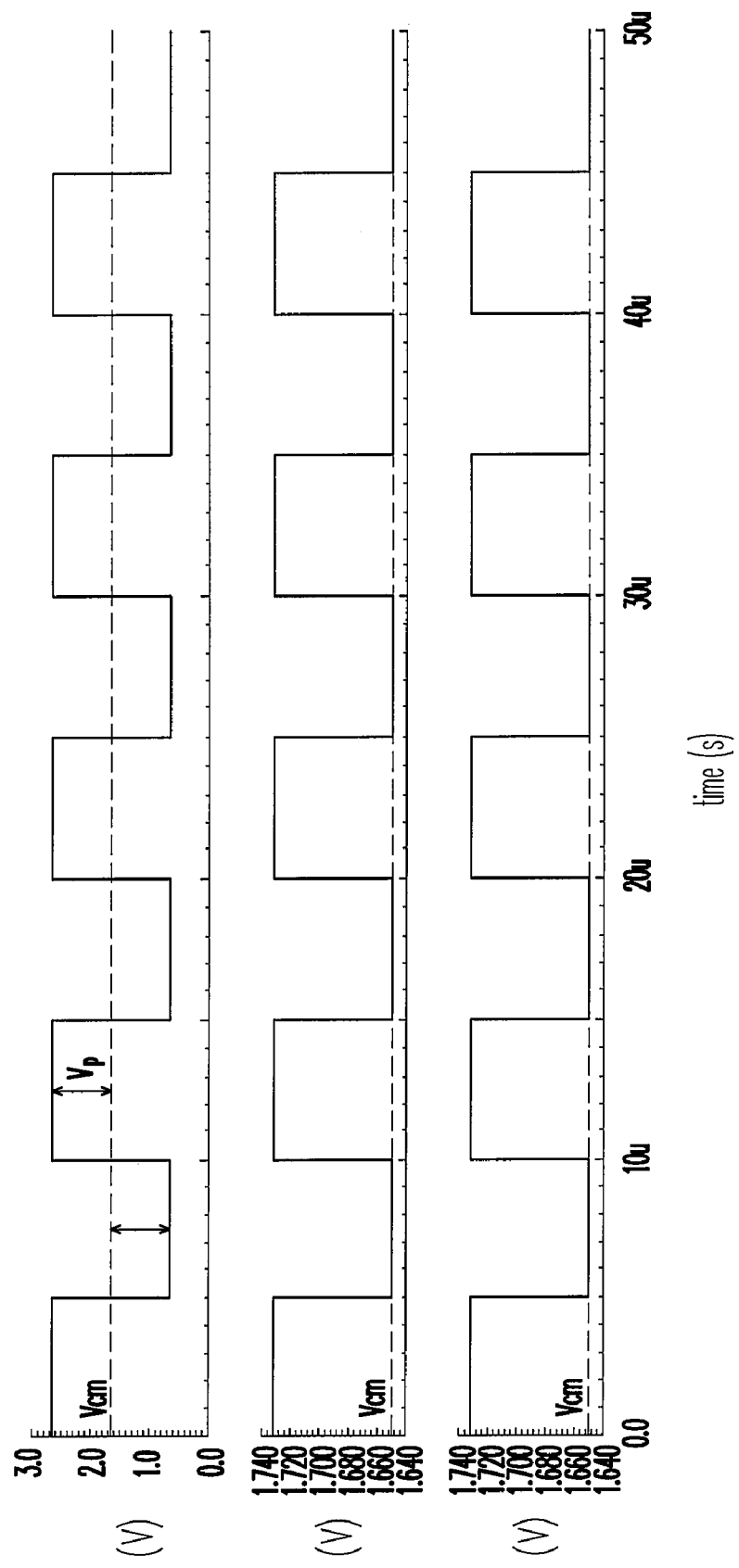
FIG. 6 and FIG. 7 are the comparison results of the sensing apparatus illustrated in FIG. 3 without and with the invented input common mode feedback circuit embodied.
Figure 7:
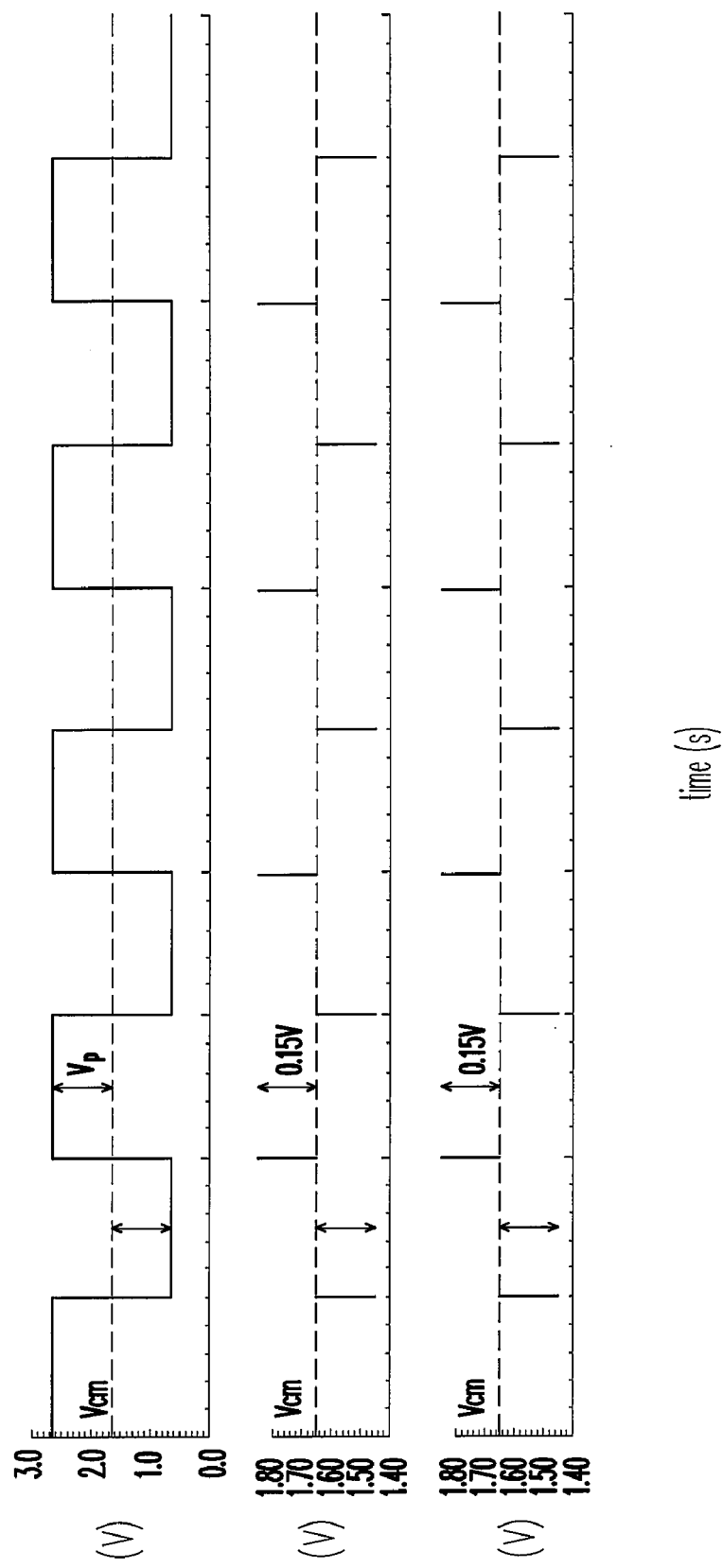

In the present embodiment in FIG. 3, two out-of-phase biasing voltages, F and S, can be applied to terminals, A and B. In order to evaluate the invented ICMFB performance, 302a and 304a are removed, S biasing voltage is also disabled, only F biasing voltage is applied to terminal A (2 Vpp square wave with period of 10 u second and 50% duty cycle) All other circuit blocks and elements are fabricated by 0.35 um CMOS process with supply voltage 3.3 Vdda and analog ground of 0 Vssa. A set common voltage is provided at Vdda/2=1.65V for the differential input amplifier. All available capacitive source impedances (301a and 303a) are fixed 0.5 pF. Shown in FIG. 6 and FIG. 7 are input common mode voltage at the input nodes of the differential input amplifier where the invented ICMFB is disabled and, on the contrary, enabled respectively. It can be shown that when the ICMFB is enabled, the input common mode voltage can be very fast restored back to the set value. But when the invented ICMFB is disabled, the input common voltage can only swing with the F biasing voltage.

Figure 8:
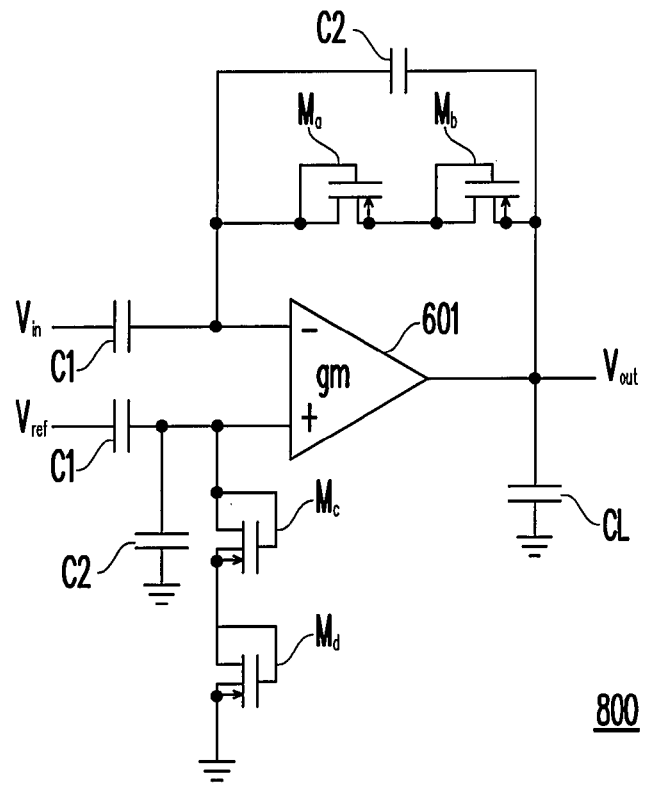
FIG. 8 is another conventional differential amplifier with capacitive input impedance C1 and C2, The source voltage V1 and Vref are coupled through C1 and C2 to the input nodes of the main amplifier 601.
Figure 9:
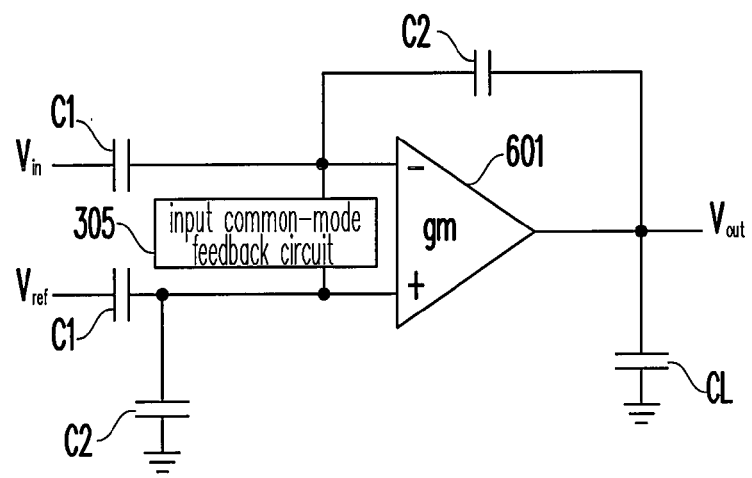
FIG. 9 is an improved version of the differential amplifier illustrated in FIG. 8 based on the invented input common mode feedback circuit with this invention.

It should be noted that the input common-mode feedback circuit 305 in FIG. 3 of the present invention may also be applied to other applications in addition to the sensing apparatus described herein. An alternative embodiment of this invention can be explained by FIG. 8 and FIG. 9. FIG. 8 is another differential input amplifier developed by Harrison et al. FIG. 9 is an improved version in accordance to current invention. The sensing apparatus 800 was designed for low bandwidth neuromorphic applications and established its dc operating points by Ma, Mb, and Mc, Md. The improved version in FIG. 9 of the improved 800 design can not only extend the working bandwidth but also allow better ICMFB correction capability and input dynamic range of Vin.

To sum up, the presented embodiments are to be considered as illustrative and not restrictive, and the invention is not to be limited to the details given herein. In view of the foregoing, it is intended that the present invention cover modifications and variations of this invention provided they fall within the scope of the following claims and their equivalents.

What is claimed is:

1. An input common-mode feedback circuit, applicable to a differential amplifier, the differential amplifier includes a positive input node and a negative input node for respectively receiving a first input signal and a second input signal, the input common-mode feedback circuit comprising:

a common-mode error amplifier, having a first input node, a second input node, a third input node, and an output node, wherein the first input node and the second input node are used to respectively receive the first input signal and the second input signal from positive and negative input nodes of the differential amplifier, and after comparing the common-mode voltage of the first input signal and the second input signal with a set common-mode voltage received by the third input node, the output node gives an amplified difference voltage; and a plurality of adaptive conductance elements comprising:

a first adaptive conductance element, having an anode coupled to the output node of the common-mode error amplifier, and a cathode coupled to the positive input node of the differential amplifier;

a second adaptive conductance element, having an anode coupled to the negative input node of the differential amplifier, and a cathode coupled to the output node of the common-mode error amplifier;

a third adaptive conductive element, having an anode coupled to the positive input node of the differential amplifier, and a cathode coupled to the output node of the common-mode error amplifier; and a fourth adaptive conductance element, having an anode coupled to the output node of the common-mode error amplifier, and a cathode coupled to the negative input node of the differential amplifier, every adaptive conductance element behaves with a low impedance characteristic when its anode voltage is greater than its cathode voltage by a positive threshold voltage (Vtp) or when its anode voltage is lower than its cathode voltage by a negative threshold voltage (Vtn), otherwise, the aforementioned adaptive conductance element behaves with a high impedance characteristic, wherein the adaptive conductance elements and the common-mode error amplifier form a negative feedback loop to inhibit shift of the common-mode voltage of the first input signal and the second input signal received by the differential amplifier.

2. The input common-mode feedback circuit as claimed in claim 1, wherein each of the adaptive conductance elements comprises a PMOS transistor having its gate and its drain coupled together, and its source coupled to its N-well, wherein the drain terminal of the PMOS transistor is the anode of each of the adaptive conductance elements, and the source terminal of the PMOS transistor is the cathode of each of the adaptive conductance elements.

3. The input common-mode feedback circuit as claimed in claim 2, wherein the PMOS transistor behaves with the characteristic of a bipolar transistor when the anode voltage of each of the adaptive conductance elements is greater than the cathode voltage by the positive threshold voltage.

4. The input common-mode feedback circuit as claimed in claim 2, wherein the PMOS transistor behaves with the characteristic of a diode-connected PMOS transistor when the anode voltage of each of the adaptive conductance elements is lower than the cathode voltage by the negative threshold voltage.

5. The input common-mode feedback circuit as claimed in claim 1, wherein the differential amplifier comprises a fully differential amplifier.

6. The input common-mode feedback circuit as claimed in claim 1, wherein the differential amplifier is a fully differential input and differential output amplifier or a differential input and single-ended output amplifier.

7. A fully differential sensing apparatus, comprising:

a fully differential amplifier, having a positive input node, a negative input node, a positive output node, and a negative output node, wherein the positive input node and the negative input node are used to respectively receive a first input signal and a second input signal;

a first input impedance, having a first terminal to receive a signal/biasing voltage and a second terminal coupled to the negative input node, and the first input impedance can be used for sensing an external stimulus;

a second input impedance, having a first terminal to receive the signal/biasing voltage and a second terminal coupled to the positive input node, and the second input impedance can be used for sensing the external stimulus;

an input common-mode feedback circuit, comprising:

a common-mode error amplifier, having a first input node, a second input node, a third input node, and an output node, wherein the first input node and the second input node are used to respectively receive the first input signal and the second input signal, and after comparing the common-mode voltage of the first input signal and the second input signal with a set common-mode voltage received by the third input node, the output node gives an amplified difference voltage; and a plurality of adaptive conductance elements comprising:
  a first adaptive conductance element, having an anode coupled to the output node of the common-mode error amplifier, and a cathode coupled to the positive input node of the differential amplifier;
  a second adaptive conductance element, having an anode coupled to the negative input node of the differential amplifier, and a cathode coupled to the output node of the common-mode error amplifier;
  a third adaptive conductive element, having an anode coupled to the positive input node of the differential amplifier, and a cathode coupled to the output node of the common-mode error amplifier; and
  a fourth adaptive conductance element, having an anode coupled to the output node of the common-mode error amplifier, and a cathode coupled to the negative input node of the differential amplifier,
every adaptive conductance element behaves with a low impedance characteristic when its anode voltage is greater than its cathode voltage by a positive threshold voltage (Vtp) or when its anode voltage is lower than its cathode voltage by a negative threshold voltage (Vtn), otherwise, the aforementioned adaptive conductance element behaves with a high impedance characteristic,
wherein the adaptive conductance elements and the common-mode error amplifier form a negative feedback loop to inhibit shift of the common-mode voltage of the first input signal and the second input signal received by the differential amplifier;
a first feedback impedance, having a first node coupled to the positive input node, and a second node coupled to the negative output node and gives a first output signal; and
a second feedback impedance, having a first end coupled to the negative input node, and a second end coupled to the positive output node and gives a second output signal.

8. The fully differential sensing apparatus as claimed in claim 7, wherein the fully differential sensing apparatus further comprises:

a third input impedance, having a first terminal coupled to the negative input node and a second terminal to receive an out-of-phase counterpart of the signal/biasing voltage, and the third input impedance can be used for sensing the external stimulus; and a fourth input impedance, having a first terminal coupled to the positive input node and a second terminal to receive the out-of-phase counterpart of the signal/biasing voltage, and the fourth input impedance can be used for sensing the external stimulus.

9. The fully differential sensing apparatus as claimed in claim 8, wherein the first input impedance and the second input impedance consist of a first group of differential sensing capacitors, and the third input impedance and the fourth input impedance consist of a second group of differential sensing capacitors.

10. The fully differential sensing apparatus as claimed in claim 8, wherein the first feedback impedance comprises a first integrating capacitor.

11. The fully differential sensing apparatus as claimed in claim 8, wherein the second feedback impedance comprises a second integrating capacitor.

12. The fully differential sensing apparatus as claimed in claim 8, wherein each of the adaptive conductance elements comprises a PMOS transistor having its gate and the drain coupled together, source s coupled to its N-well; the drain terminal of the PMOS transistor is the anode of each of the adaptive conductance elements, and the source terminal of the PMOS transistor is the cathode of each of the adaptive conductance elements.

13. The fully differential sensing apparatus as claimed in claim 8, wherein the diode-connected PMOS transistor behaves with the characteristic of the bipolar transistor when the anode voltage of each of the adaptive conductance elements is greater than the cathode voltage by the positive threshold voltage.

14. The fully differential sensing apparatus as claimed in claim 8, wherein the diode-connected PMOS transistor behaves with the characteristic of the diode-connected PMOS transistor when the anode voltage of each of the adaptive conductance elements is lower than the cathode voltage by the negative threshold voltage.

15. The fully differential sensing apparatus as claimed in claim 8, wherein the amplified difference voltage is obtained by subtracting the set input common-mode voltage form the average value of the sum of the first input signal and the second input signal.

* * * * *